(12) United States Patent
Ankireddi

(10) Patent No.: US 7,397,664 B2
(45) Date of Patent: Jul. 8, 2008

(54) HEATSPREADER FOR SINGLE-DEVICE AND MULTI-DEVICE MODULES

(75) Inventor: Seshasayee S. Ankireddi, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 95 days.

(21) Appl. No.: 11/438,963

(22) Filed: May 22, 2006

(65) Prior Publication Data

US 2007/0268673 A1 Nov. 22, 2007

(51) Int. Cl.
*H05K 7/20* (2006.01)
*H01L 23/36* (2006.01)

(52) U.S. Cl. ............... 361/710; 361/699; 361/700; 361/710; 361/715; 165/80.3; 165/80.4; 165/185; 257/717; 257/718; 174/16.1; 174/252

(58) Field of Classification Search ......... 361/704–707, 361/709–712, 717, 719, 698, 699, 700; 165/80.3, 165/80.4, 185, 104.33; 257/706–727; 174/16.1, 174/16.3, 252
See application file for complete search history.

(56) References Cited

U.S. PATENT DOCUMENTS

| | | | | |
|---|---|---|---|---|
| 4,226,281 A | * | 10/1980 | Chu ............... | 165/80.2 |
| 4,381,032 A | * | 4/1983 | Cutchaw .......... | 165/46 |
| 4,483,389 A | * | 11/1984 | Balderes et al. ... | 165/80.3 |
| 4,715,430 A | * | 12/1987 | Arnold et al. ..... | 165/80.3 |
| 5,046,552 A | * | 9/1991 | Tousignant ....... | 165/46 |
| 5,528,337 A | * | 6/1996 | Kawano ........... | 396/502 |
| 5,714,738 A | * | 2/1998 | Hauschulz et al. . | 219/535 |
| 5,920,457 A | * | 7/1999 | Lamb et al. ...... | 361/699 |
| 6,650,538 B1 | * | 11/2003 | Chu et al. ........ | 361/688 |
| 6,690,578 B2 | * | 2/2004 | Edelmann ......... | 361/699 |
| 6,867,976 B2 | * | 3/2005 | Belady et al. ..... | 361/704 |
| 7,206,203 B2 | * | 4/2007 | Campbell et al. .. | 361/699 |
| 2003/0150605 A1 | * | 8/2003 | Belady et al. ..... | 165/185 |

OTHER PUBLICATIONS

The Article: "Liquid Cooled Module With Compliant membrane", IBM Technical Disclosure Bulletin, Jul. 1977, vol.# 20; Issue#:2; pp. 673-674.*

* cited by examiner

*Primary Examiner*—Michael V Datskovskiy
(74) *Attorney, Agent, or Firm*—Martine Penilla & Gencarella, LLP

(57) ABSTRACT

A heatsink includes a heatsink base, an elastomeric base, multiple slider pins and an alignment frame coupled to the heatsink base. The elastomeric base includes multiple holes, the elastomeric base coupled to the perimeter of the heatsink base. Each of the slider pins secured in one of the holes in the elastomeric base. The alignment frame supporting and aligning the slider pins as the slider pins move in a direction substantially perpendicular to the heatsink base. A method of assembling a heat spreader is also described.

17 Claims, 9 Drawing Sheets

HEATSPREADER FOR SINGLE-DEVICE AND MULTI-DEVICE MODULES

BACKGROUND

The present invention relates generally to packaging semiconductor devices and more specifically systems and methods for packaging multiple semiconductor devices using a single heatsink.

The demand for increased performance from computer hardware often requires processor (CPU) and application specific integrated circuit (ASIC) designers to place multiple components (e.g., memory controllers, caches, DC-DC converters, ASICs, application specific standard product (AS-SPs) etc.) in close proximity to CPUs on specialized "daughter" module circuit cards. The daughter module circuit cards interface with the system motherboards.

FIG. 1 shows a typical multi-package module (MPM) 100. The MPM includes multiple components 102A-C, 104, 106, 108, 110 mounted on the module circuit card 130. Each of the components has a corresponding, individual packaging (i.e., substrate 112, 116, 118, 120, lid 122, 126, 128, respectively, etc.). FIG. 2 shows a typical multi-chip module (MCM) 200. The MCM includes multiple components 202, 204, 206, 208 mounted on a module circuit card 230. Each of the components 202, 204, 206, 208 are individually unpackaged (i.e., do not include a corresponding lid, full heatsink, etc.). The use of MCM/MPM technologies helps hardware designers leverage advances in technology while also using high speed data and power buses without compromising on signal trace lengths, thereby delivering compute performance.

One of the key challenges facing the thermal engineer in designing cooling solutions for MPMs/MCMs is the ability to transfer the heat away from each of the multiple, closely placed sources 102A-110 and 202-208. FIG. 3 shows a typical cooling solution 300 for the MPM 100. The cooling solution 300 accounts for normal manufacturing and assembly tolerances in the various package and module stacks by having varying thermal interface material (TIM) 302, 304, 306, 308, 310 thicknesses (referred to as bondline thickness). Unfortunately, an optimal bondline thickness of the TIM 302, 304, 306, 308, 310 cannot be maintained due to the various package heights. The optimal bondline thickness is the thickness in which the TIM 302, 304, 306, 308, 310 can best conduct the thermal energy from the respective sources 102A-110 to the heatsink 330. As a result, the respective sources 102A-110 are not reliably and consistently cooled. This problem is significantly exacerbated when the physical dimensions of the MPM 100 or the MCM 200 are relatively large (e.g., when there are multiple heat-producing devices that are closely placed over a large area).

The preceding problem of ineffective heat transfer is not restricted to the MPM 100 or the MCM 200. Similar problems also exist for packages and dies mounted to circuit boards. For example, due to the assembly process a package interface (i.e., lid surface for lidded packages, die surface for lidless packages) through which heat transfer must occur may not be coplanar with the heatsink base. The lack of co-planarity with the heatsink base can be caused by normal production tolerances.

In view of the foregoing, there is a need for an easily produced cooling solution that can be used for multiple package thicknesses and multiple package areas and distributions throughout a single larger area while substantially compensating for any lack of co-planarity and also substantially maintaining an optimum bondline thickness for the TIM.

SUMMARY

Broadly speaking, the present invention fills these needs by providing a manufacturable solution that overcomes the stack up tolerance and co-planarity problems associated with single die/package components, MPMs and MCMs and facilitates effective heat removal from those devices. It should be appreciated that the present invention can be implemented in numerous ways, including as a process, an apparatus, a system, computer readable media, or a device. Several inventive embodiments of the present invention are described below.

One embodiment provides a heatsink includes a heatsink base, an elastomeric base, multiple slider pins and an alignment frame coupled to the heatsink base. The elastomeric base includes multiple holes, the elastomeric base coupled to the perimeter of the heatsink base. Each of the slider pins can be secured in one of the holes in the elastomeric base. The alignment frame can support and align the slider pins as the slider pins move in a direction substantially perpendicular to the heatsink base.

The heatsink can also include at least one cushion spring between the elastomeric base and the alignment frame. The at least one cushion spring is located proximate to a perimeter of the plurality of slider pins. The heatsink can also include a captivated heat transfer material contained in a cavity between the elastomeric base and the heatsink base. The captivated heat transfer material can be a fluid or a gas or a liquid metal.

The heatsink can also include an inlet coupled to the cavity between the elastomeric base and the heatsink base and an outlet coupled to the cavity between the elastomeric base and the heatsink base. The captivated heat transfer material can be flowed into, through and out of the cavity between the elastomeric base and the heatsink base.

The slider pins can be arranged in an array. The array being a shape similar to a heat source. The heatsink can be coupled to a substrate and the substrate can include a heat source mounted on the substrate and a quantity of thermal interface material between the heat source and the slider pins. The slider pins compressing the thermal interface material to a desired bondline thickness. The heat source can include a semiconductor device. The heat source can include a lid on the semiconductor device.

The alignment frame can include multiple alignment frames and the slider pins can be divided into multiple arrays of slider pins. Each one of the alignment frames supporting and aligning a corresponding one of the arrays of slider pins.

Another embodiment provides a heatsink including a heatsink base, an elastomeric base, multiple slider pins, an alignment frame coupled to the heatsink base, at least one cushion spring between the elastomeric base and the alignment frame and a captivated heat transfer material contained in a cavity between the elastomeric base and the heatsink base. The elastomeric base includes multiple holes. The elastomeric base is coupled to the perimeter of the heatsink base. Each of the slider pins secured in one of the holes in the elastomeric base. The alignment frame supports and aligns the slider pins as the slider pins move in a direction substantially perpendicular to the heatsink base. The at least one cushion spring is located proximate to a perimeter of the slider pins. The heatsink is coupled to a substrate and the substrate includes a heat source mounted on the substrate and a quantity of thermal interface material between the heat source and the slider pins. The slider pins compress the thermal interface material to a desired bondline thickness.

Yet another embodiment provides a method of assembling a heat spreader. The method includes dispensing a desired quantity of thermal interface material to a heat source mounted on a substrate and positioning the heat spreader in a desired position. The heat spreader includes a heatsink base, an elastomeric base including multiple holes, the elastomeric base is coupled to the perimeter of the heatsink base and multiple slider pins. Each of the slider pins secured in one of the holes in the elastomeric base and an alignment frame coupled to the heatsink base. The alignment frame supporting and aligning the slider pins as the slider pins move in a direction substantially perpendicular to the heatsink base. The desired position aligns the slider pins with a heat source. A compression load is applied to the heat spreader to compress the heat spreader to the substrate until the thermal interface material has a desired bondline thickness.

The method can also include securing the heat spreader to the substrate. The heat spreader can also include at least one cushion spring between the elastomeric base and the alignment frame. The at least one cushion spring located proximate to a perimeter of the slider pins.

The heat spreader can also include a captivated heat transfer material contained in a cavity between the elastomeric base and the heatsink base. The heat spreader can also include an inlet coupled to the cavity between the elastomeric base and the heatsink base and an outlet coupled to the cavity between the elastomeric base and the heatsink base. The method can also include flowing the captivated heat transfer material into, through and out of the cavity between the elastomeric base and the heatsink base.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for a heat spreader will now be described. It will be apparent to those skilled in the art that the present invention may be practiced without some or all of the specific details set forth herein.

Embodiments of the present invention provide an easily produced cooling solution that can be used for single and multiple package thicknesses, areas and distributions throughout the area. The cooling solutions described herein also substantially compensate for any lack of co-planarity of the multiple packages and also between each the packages and the heatsink. The lack of co-planarity can be a result of a tilt or a convex or concave curvature of the packages and/or board assembly being cooled. The cooling solutions described herein also substantially maintain an optimum bondline thickness for the thermal interface material (TIM) between each of the packages being cooled and the heatsink.

Figure 1:
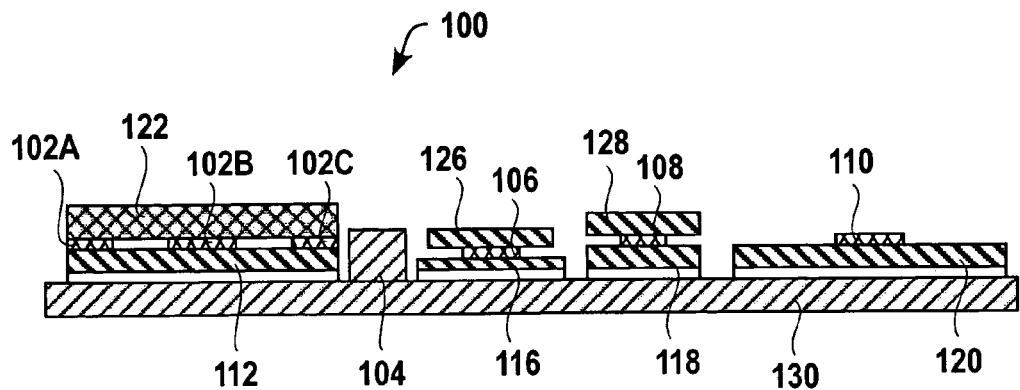
FIG. 1 shows a typical multi-package module (MPM).
Figure 2:
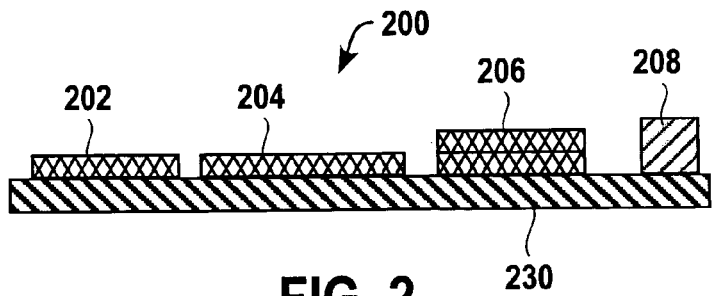
FIG. 2 shows a typical multi-chip module (MCM).
Figure 3:
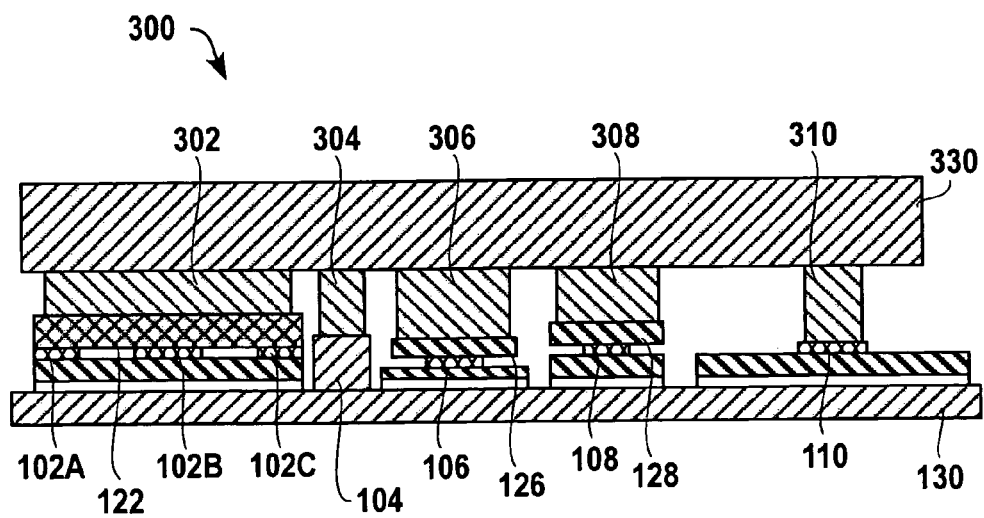
FIG. 3 shows a typical cooling solution for the MPM.
Figure 4A:
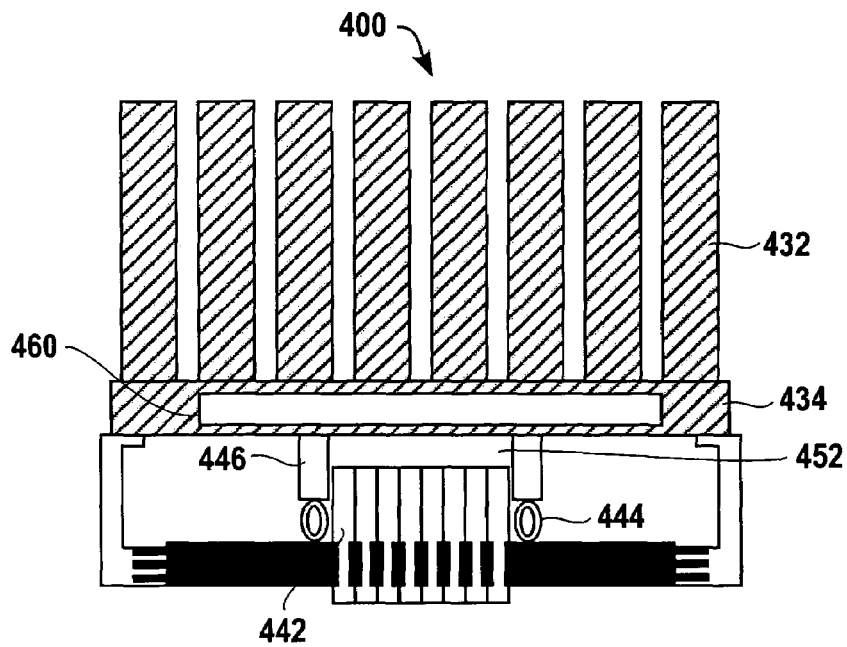
FIGS. 4A-C illustrate a single device heat spreader, in accordance with an embodiment of the present invention.
Figure 4B:
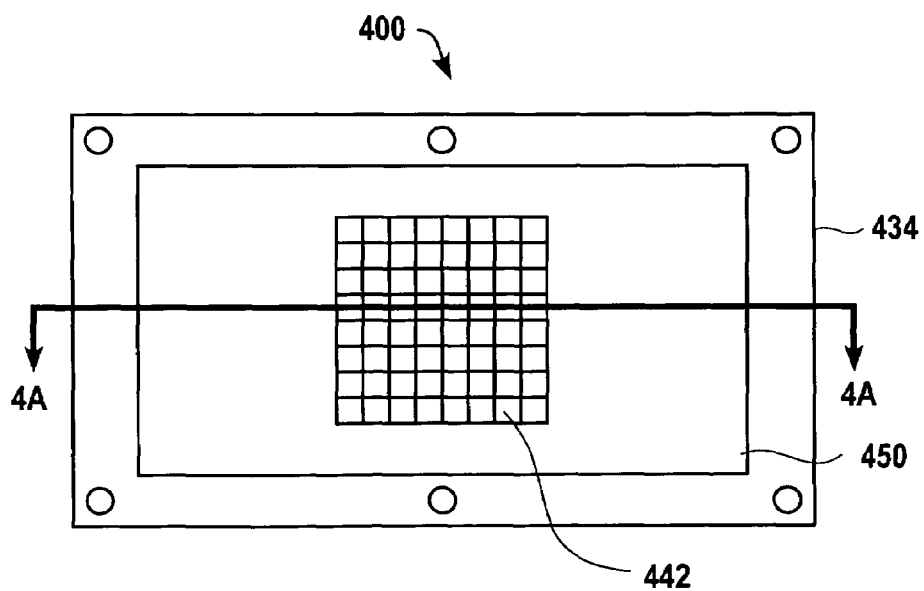
Figure 4C:
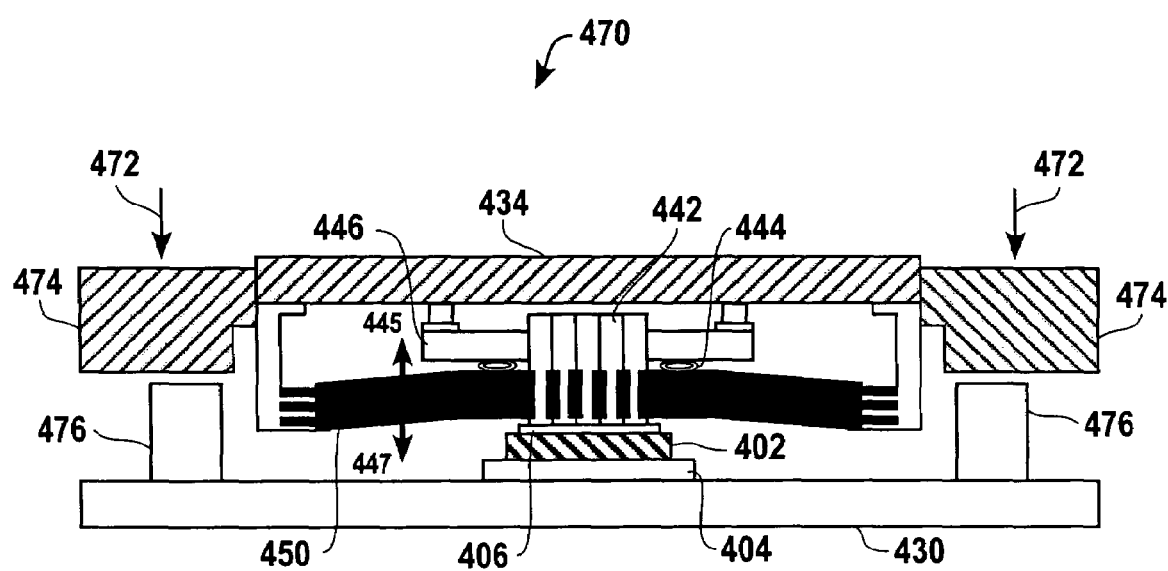

FIGS. 4A-C illustrate a single device heat spreader 400, in accordance with an embodiment of the present invention. The single device heat spreader 400 is intended to be used for a single heat source device. As will be described in more detail below, the single device heat spreader 400 can be used with multiple devices with very slight modification. The heat spreader 400 includes set of slider pins 442 arranged in a desired shape (e.g., a square, rectangle, circle, ellipse, etc.). The slider pins 442 receive heat from the source 402 through an appropriate thermal interface material 406. The slider pins 442 can be made of any suitable high conductivity material. By way of example the slider pins 442 can be made from metallic materials (e.g., copper, aluminum, iron, nickel, etc.) or a composite material including one or more materials (e.g., oriented graphite). It should be noted that these slider pin materials are merely exemplary materials and that any suitable materials and combinations thereof can be used for the slider pins.

An alignment frame 446 provides lateral (side to side and front to back) support for the slider pins 442. The alignment frame 446 allows the slider pins 442 to move in vertical directions 445 and 447, relative to the substrate 430. The alignment frame 446 is mounted to and thermally coupled to the heatsink base 434. A deformable elastomeric base 450 includes an array of holes for securely holding the slider pins 442. The slider pins 442 can move relative to each other in the deformable elastomeric base 450. Because the slider pins 442 can move relative to each other, the slider pins can conform to a shape of a heat source and absorb planarity variations. A cushion spring 444 couples the elastomeric base 450 to the frame 446. The cushion spring 444 also supports the deformable elastomeric base 450 in the immediate vicinity (e.g., near the perimeter) of the slider pins 442. The precise location of the cushion spring 444 relative to the slider pins 442 can be selected to provide a desired amount of support to the elastomeric base 450.

A fin structure 432 can also be mounted to the heatsink base 434. The heatsink base 434 can also include a cavity 460 through which a cooling media (e.g., gaseous, fluid, etc.) can be flowed to transport heat away from the heatsink base. A captivated heat transfer material 452 (e.g., a liquid metal or suitable material) can also be included between the deformable elastomeric base 450 and the heatsink base 434. The captivated heat transfer material 452 aids in the heat transfer from the slider pins 442 to the heatsink base 434. The deformable elastomeric base 450 can be formed from The deformable elastomeric base 450 can include one or more natural, polyacrilic or polysulfide rubbers or a polyisoprene, polybutadiene or any of several silicone containing materials and any other suitable materials and any combinations thereof. It should be understood that these are merely exemplary materials for the elastomeric elastomeric base and that any suitable materials or combinations thereof can be used.

The alignment frame 446 can be designed in several ways to aid the effectiveness of the slider pins 442 in heat transfer to the captivated heat transfer material 452, and then to the heatsink base 434. Similarly, the cushion spring 444 can also be designed in any one of several ways to aid the effectiveness of the slider pins 442 in heat transfer to the captivated heat transfer material 452, and then to the heatsink base 434.

As shown in FIG. 4C, the single device heat spreader 400 is placed on the heat source (e.g., die) 402 to be cooled. A suitable thermal interface material (TIM) 406 is placed between the set of slider pins 442 and the die 402. It should be understood that the die 402 could also include a lidded package as are well known in the art. As a compression load 472 is applied to compress the heatsink base 434 toward the substrate 430, the elastomeric base 450 is stretched upward as shown. The stretched elastomeric base 450 pulls the slider pins 442 toward the die 402, compressing the TIM 406 between the slider pins and the die. The stretching load in the elastomeric base compresses the TIM 406 to a desired, optimum bondline thickness. The desired, optimum bondline thickness ensures optimum heat transfer from the die 402 to the slider pins 442. The precise optimum bondline thickness is determined by the desired heat load, the specific TIM being used and many other factors that are well known in the art.

Figure 4D:
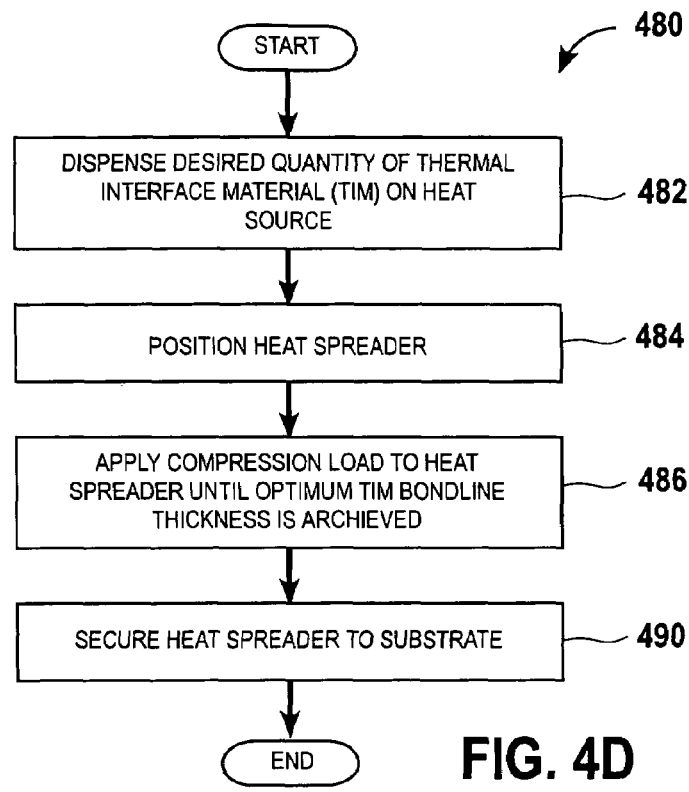
FIG. 4D is a flowchart of the method operations for assembly of the single device heat spreader, in accordance with an embodiment of the present invention.

FIG. 4D is a flowchart of the method operations 480 for assembly of the single device heat spreader 400, in accordance with an embodiment of the present invention. In an operation 482, a desired quantity of thermal interface material (TIM) 406 is dispensed on the heat source 402. In an operation 484, the single device heat spreader 400 is positioned in the desired position to align the set of slider pins 442 with the heat source 402.

In an operation 486, a compression load 472 is applied to the heat spreader 400. The compression load 472 can be applied to the edges 474 of the heat spreader 400. The compression load 472 applies a stretching (tensile) load to the elastomeric base 450. Since the slider pin set 442 is captured in the elastomeric base 450 and cannot move relative to it, the localized stretching load in the elastomeric material near the heat source 402 compresses the TIM 406. The slider pin set 442 drives the bondline thickness to the desired amount for efficient heat transfer.

In an operation 490, the heat spreader 400 is secured to the substrate 430 supporting the heat source 402. The heat spreader 400 can be secured to the substrate 430 with a mechanical fastener (e.g., a screw, bolt, rivet, latch, etc.) or other mechanical manner (e.g., adhesive, etc.). The method operations can then end.

Figure 5C:
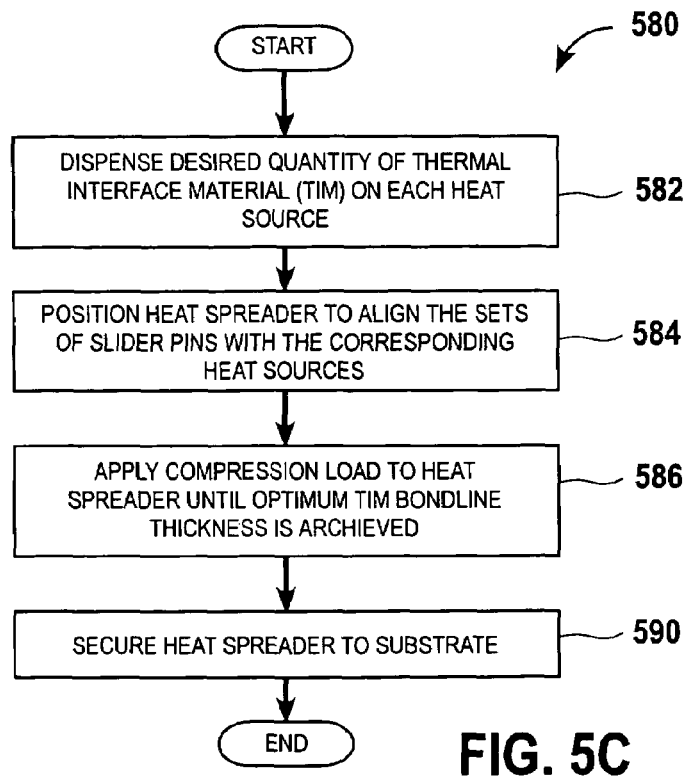
FIG. 5C is a flowchart of the method operations for assembly of the multiple device heat spreader, in accordance with an embodiment of the present invention.
Figure 5A:
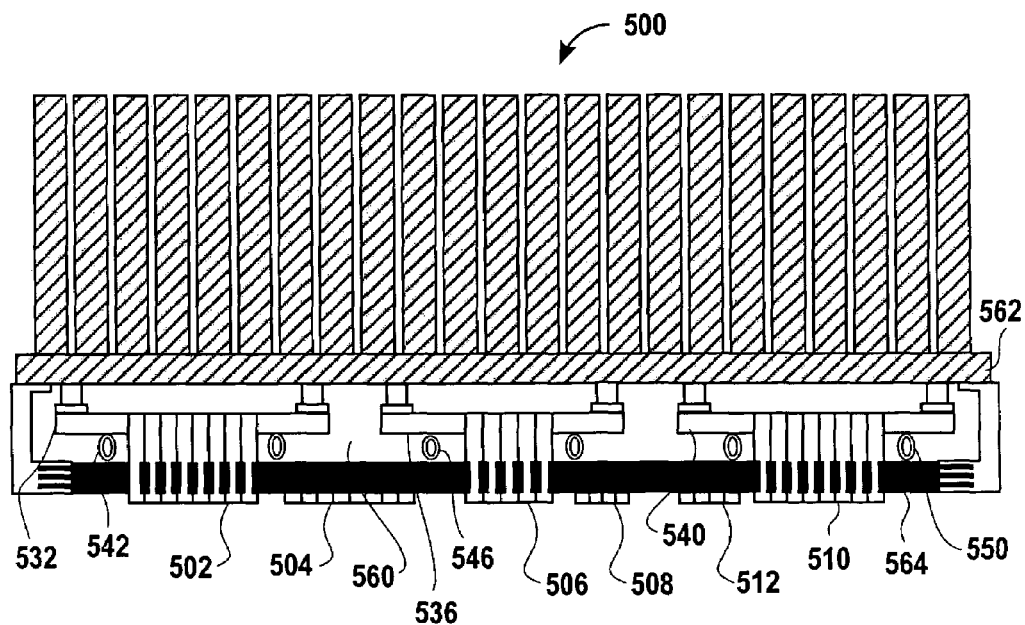
FIGS. 5A and 5B show a multiple device heat spreader, in accordance with an embodiment of the present invention.
Figure 5B:
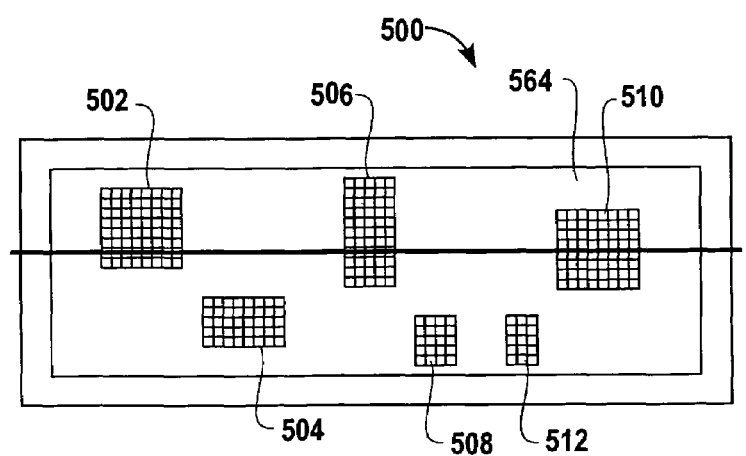

FIGS. 5A and 5B show a multiple device heat spreader 500, in accordance with an embodiment of the present invention. The multiple device heat spreader 500 is an extension of the single device heat spreader 400 for multiple heat sources of various sizes and that are geographically dispersed on a single module. The multiple device heat spreader 500 includes multiple sets of slider pins 502-512, one set of pins for each discrete heat source on the MPM. It should also be noted that a single set of slider pins could also be used to provide a heat spreader for multiple, closely spaced devices or heat sources. Each set of slider pins 502-512 is independently controlled by a corresponding alignment frame 532-540 and cushion spring 542-550. Each of the respective sets of slider pins 502-512 transfers heat from the respective source into a common volume of captivated heat transfer material 560 between the elastomeric base material 564 and the heatsink base 562. The captivated heat transfer material 560 transfers the heat to the heatsink base 562.

The cushion springs 542-550 for each source can be selectively designed independently to compensate for a variety of factors. These factors can include a location of the heat source on the module, a stiffness and strength characteristics of the elastomeric base material 564 used for the multiple device heat spreader 500, a load bearing capability of the captivated heat transfer material 560, and any anticipated deformation of the spring/loading requirements. These factors can be compensated for to maintain a specific bondline thickness for each set of slider pins 502-512.

Essentially, the multiple device heat spreader 500 is a combination of multiple independently operating single device heat spreaders 400 supported by a single, common elastomeric base 564 and a common heatsink base 562. Assembly of the multiple device heat spreader 500 also proceeds in a similar manner to that for the single device heat spreader 400 described above.

FIG. 5C is a flowchart of the method operations 580 for assembly of the multiple device heat spreader 500, in accordance with an embodiment of the present invention. In an operation 582, a desired quantity of thermal interface material (TIM) is dispensed on each heat source. In an operation 584, the multiple device heat spreader 500 is positioned in the desired position to align the sets of slider pins 502-512A with the corresponding heat sources.

In an operation 586, a compression load is applied to the heat spreader 500. The compression load applies a stretching (tensile) load to the elastomeric base 564. Since each slider pin set 502-512 is captured in the elastomeric base 564 and cannot move relative to it, the localized stretching load in the elastomeric material near each source compresses the TIM. Each slider pin set 502-512 drives the bondline thickness to the desired amount for efficient heat transfer. In an operation 590, the heat spreader 500 is secured to a substrate supporting the heat sources. The method operations can then end.

The multiple device heat spreader 500 provides an effective way to span across multiple heat sources of various sizes that are geographically dispersed on a given module board and provides an efficient mechanism for heat removal. The single device heat spreader 400 works well with single device applications and the multiple device heat spreader 500 works well in multiple chip modules and multiple processor modules.

Figure 6A:
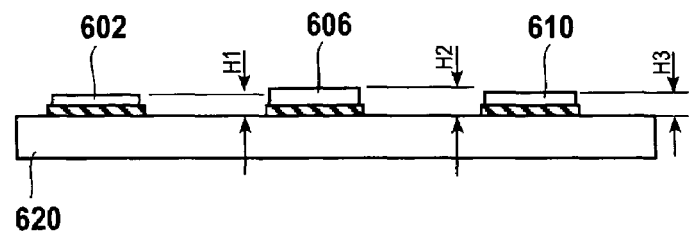
FIGS. 6A and 6B illustrate the multiple device heat spreader and multiple devices, in accordance with an embodiment of the present invention.
Figure 6B:
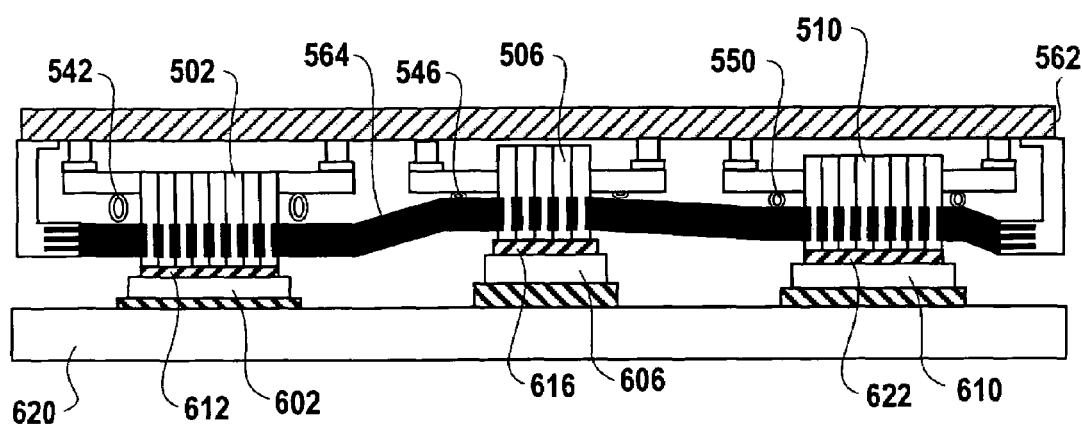

The heat spreaders 400 and 500 can accommodate all of the as-designed component height variations and manufacturing/assembly tolerances that commonly occur in MPM/MCM design while also providing efficient heat transfer from the heat sources involved. FIGS. 6A and 6B illustrate the multiple device heat spreader 500 and multiple devices 602, 606, 610, in accordance with an embodiment of the present invention. Multiple devices 602, 606, 610 on a circuit board 620 have different assembled heights H1, H2 and H3 respectively. The multiple device heat spreader 500 can span across all of the multiple devices 602, 606, 610 providing contact areas for efficient heat removal. The elastomeric base 564 compensate for the different assembled heights H1, H2 and H3 by allowing the corresponding sliding pin sets 502, 506 and 510 to automatically adjust. The elastomeric base 564 and the cushion springs 542, 546 and 550 maintain a desired pressure on each of the corresponding sliding pin sets 502, 506 and 510 to compress the TIM 612, 616, 622 to the desired bondline thickness.

Figure 7A:
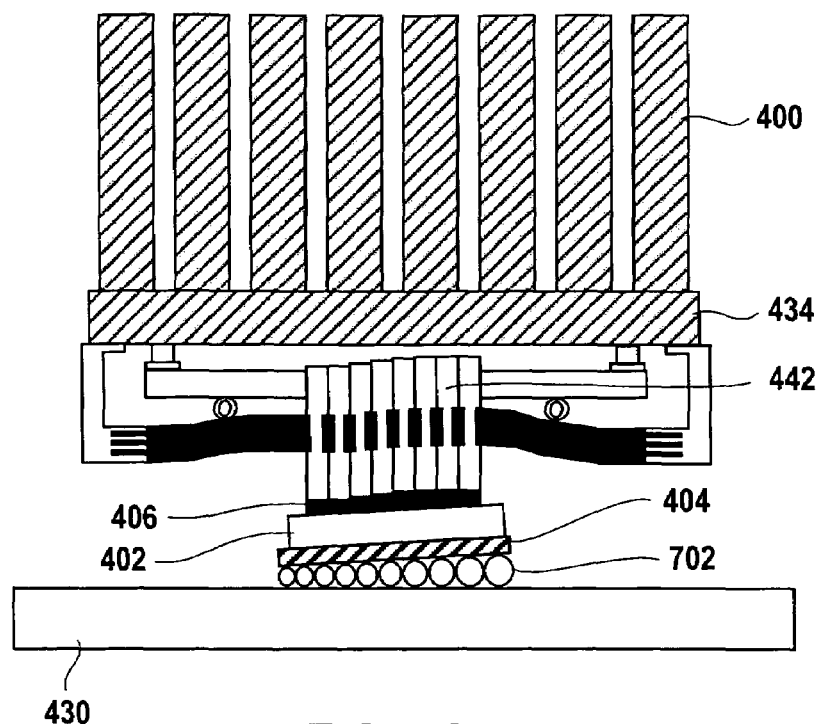
FIGS. 7A-D illustrate the single device heat spreader used several different applications, in accordance with embodiments of the present invention.
Figure 7B:
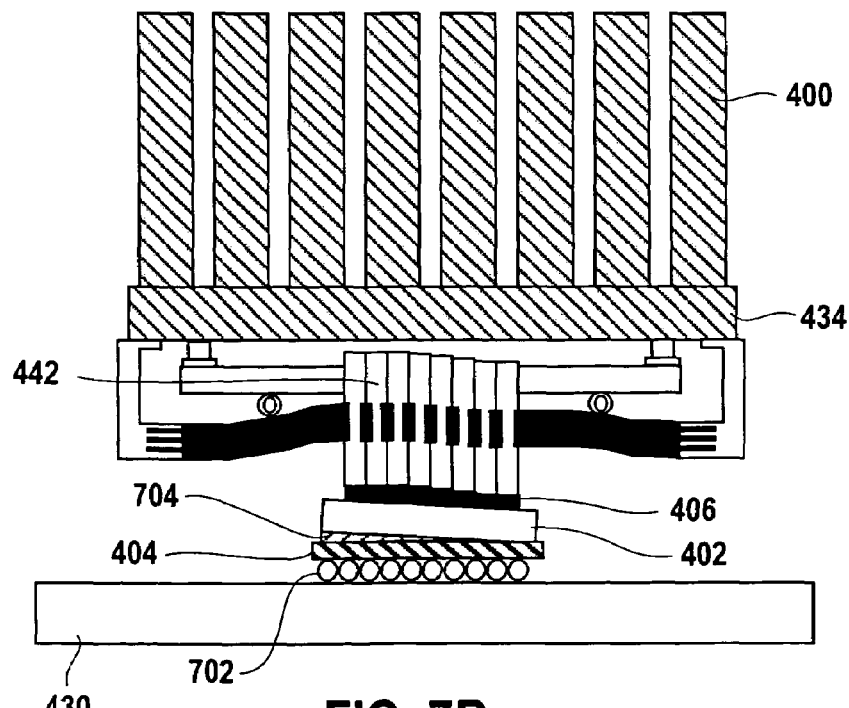
Figure 7C:
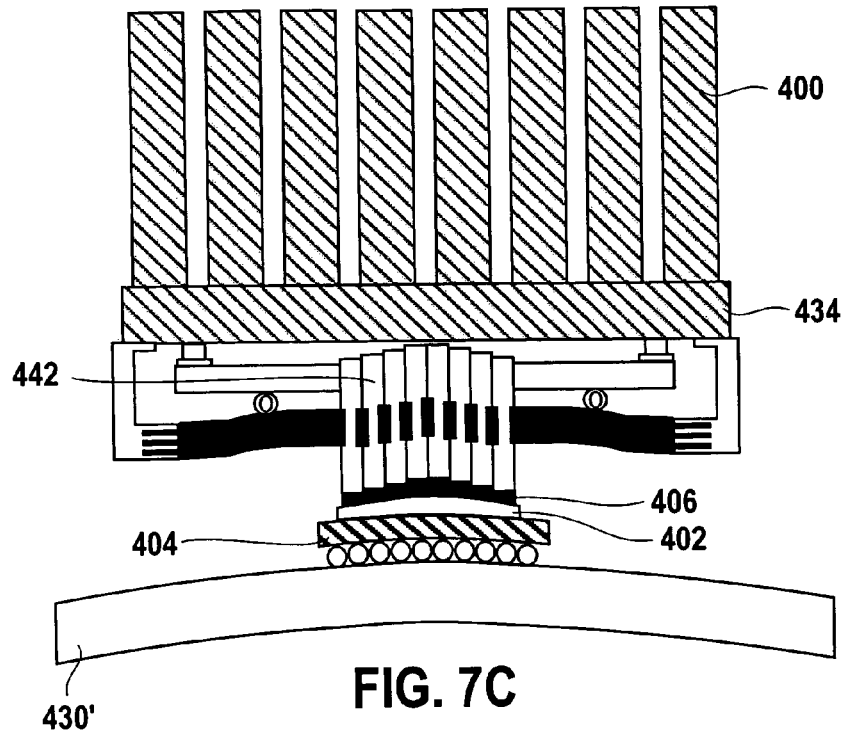
Figure 7D:
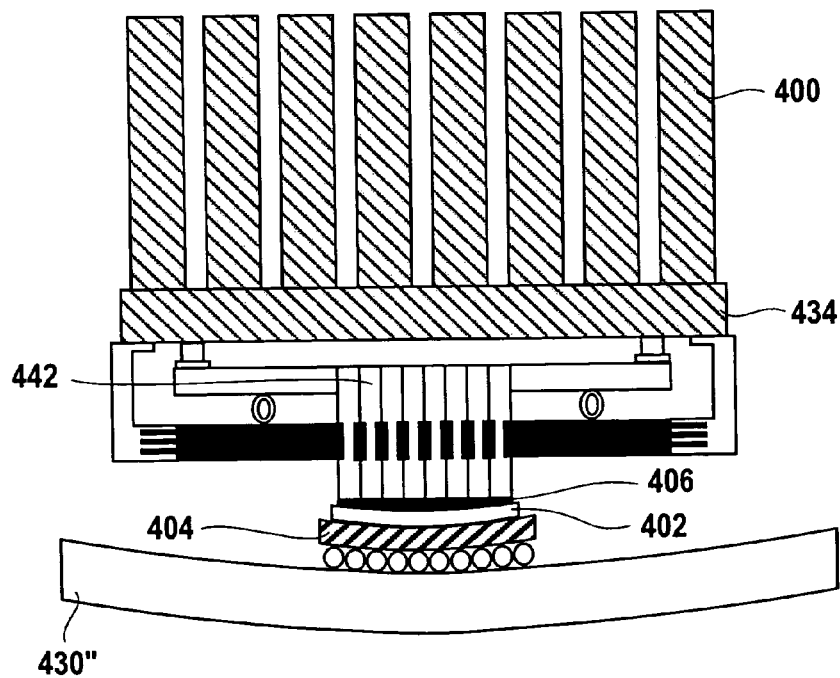

At a source level, whether in a single device mode or as part of a MCM/MPM, the heat spreaders 400 and 500 can also accommodate issues such as interconnect height variation and lack of co-planarity. FIGS. 7A-D illustrate the single device heat spreader 400 used several different applications, in accordance with embodiments of the present invention. Referring first to FIG. 7A, the device 402 is tilted (i.e., not co-planar with the heatsink base 434 due to uneven solder contacts 702. FIG. 7B shows the device 402, package 404 and solder contacts 702 have a "package" height variation, resulting from lid assembly issues and a resulting tilt relative to the heatsink base 434. FIG. 7C shows a convex assembly warp and FIG. 7D shows a concave assembly warp. As shown in FIGS. 7A-D the single device heat spreader 400 substantially maintains a desired bondline thickness of the TIM 406 even though the device 404 is not co-planar or is warped.

Figure 8A:
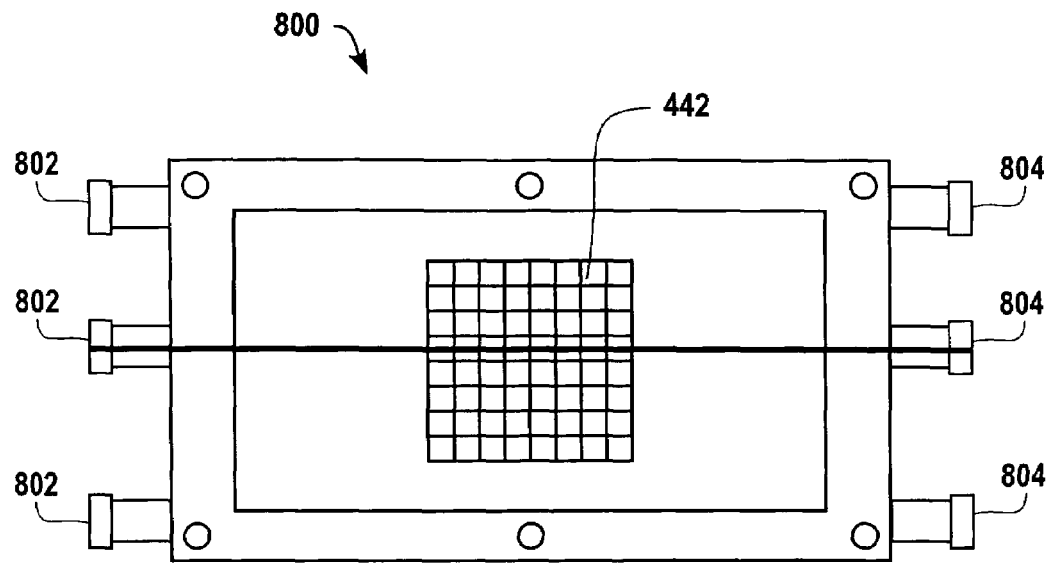
FIGS. 8A and 8B illustrate a fluid cooled heat spreader, in accordance with an embodiment of the present invention.
Figure 8B:
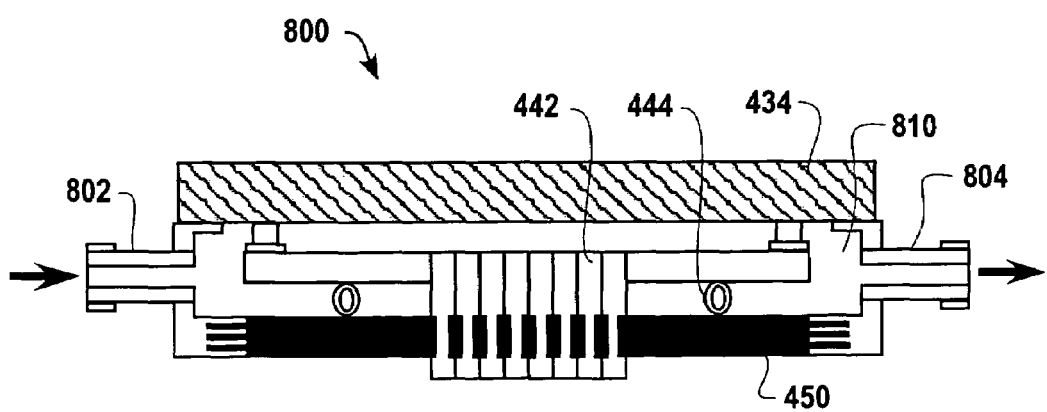

Other styles of cooling can also be used with the heat spreaders 400 and 500 described above. Recall the captivated heat transfer material 452 has been referred to as a liquid metal, however it should be understood that the captivated heat transfer material could include one or more of several media options and combinations thereof. FIGS. 8A and 8B illustrate a fluid cooled heat spreader 800, in accordance with an embodiment of the present invention. The fluid cooled heat spreader 800 is substantially similar to the heat spreaders 400 and 500 described above with the exception that the captivated heat transfer materials 452, 560 can be circulated into, through and out of the cavity 810 between the heatsink base 434 and the elastomeric base 450. Inlet fittings 802 allow a cooling fluid to flow into the cavity 810 and the outlet fittings allow the cooling fluid to flow out of the cavity. The cooling fluid can then transport heat from the slider pins 442, the elastomeric base 450 and the heatsink base 434 to an external site where the cooling fluid can be cooled and possibly recycled. The choice of the cooling fluid can be any suitable fluid including gases, aqueous solutions, liquid metal, etc. It should be understood that these are merely exemplary cooling fluids and that any suitable cooling fluid can be used. The pressure of the cooling fluid in the cavity 810 can also provide support for the elastomeric base 450. The pressure of the cooling fluid in the cavity 810 can therefore assist the elastomeric base 450, the spring cushions 444 in applying the desired pressure to the TIM 406.

It should be appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A heatsink comprising:
   a heatsink base;
   an elastomeric base including a plurality of holes, the elastomeric base coupled to the perimeter of the heatsink base;
   a plurality of slider pins, each of the slider pins secured in one of the plurality of holes in the elastomeric base;
   an alignment frame coupled to the heatsink base, the alignment frame supporting and aligning the plurality of slider pins as the slider pins move in a direction substantially perpendicular to the heatsink base and;
   at least one cushion spring between the elastomeric base and the alignment frame, the at least one cushion spring located proximate to a perimeter of the plurality of slider pins.

2. The heatsink of claim 1, further comprising a captivated heat transfer material contained in a cavity between the elastomeric base and the heatsink base.

3. The heatsink of claim 2, wherein the captivated heat transfer material is a fluid.

4. The heatsink of claim 2, wherein the captivated heat transfer material is a gas.

5. The heatsink of claim 2, wherein the captivated heat transfer material is a liquid metal.

6. The heatsink of claim 2, further comprising:
   an inlet coupled to the cavity between the elastomeric base and the heatsink base; and
   an outlet coupled to the cavity between the elastomeric base and the heatsink base, wherein the captivated heat transfer material is flowed into, through and out of the cavity between the elastomeric base and the heatsink base.

7. The heatsink of claim 1, wherein the plurality of slider pins are arranged in an array, the array being a shape similar to a heat source.

8. The heatsink of claim 1, wherein the heatsink is coupled to a substrate and wherein the substrate includes:
   a heat source mounted on the substrate; and
   a quantity of thermal interface material between the heat source and the plurality of slider pins, the plurality of slider pins compressing the thermal interface material to a desired bondline thickness.

9. The heatsink of claim 8, wherein the heat source includes a semiconductor device.

10. The heatsink of claim 9, wherein the heat source includes a lid on the semiconductor device.

11. The heatsink of claim 1, wherein the alignment frame includes a plurality of alignment frames and wherein the plurality of slider pins are divided into a plurality of arrays of slider pins, each one of the plurality of alignment frames supporting and aligning a corresponding one of the plurality of arrays of slider pins.

12. A heatsink comprising:
   a heatsink base;
   an elastomeric base including a plurality of holes, the elastomeric base coupled to the perimeter of the heatsink base;
   a plurality of slider pins, each of the slider pins secured in one of the plurality of holes in the elastomeric base;
   an alignment frame coupled to the heatsink base, the alignment frame supporting and aligning the plurality of slider pins as the slider pins move in a direction substantially perpendicular to the heatsink base;
   at least one cushion spring between the elastomeric base and the alignment frame, the at least one cushion spring located proximate to a perimeter of the plurality of slider pins; and
   a captivated heat transfer material contained in a cavity between the elastomeric base and the heatsink base;
   wherein the heatsink is coupled to a substrate and wherein the substrate includes:
      a heat source mounted on the substrate; and
      a quantity of thermal interface material between the heat source and the plurality of slider pins, the plurality of slider pins compressing the thermal interface material to a desired bondline thickness.

13. A method of assembling a heat spreader comprising:
   dispensing a desired quantity of thermal interface material to a heat source mounted on a substrate;
   positioning the heat spreader in a desired position, wherein the heat spreader includes:
      a heatsink base;

an elastomeric base including a plurality of holes, the elastomeric base coupled to the perimeter of the heatsink base;

a plurality of slider pins, each of the slider pins secured in one of the plurality of holes in the elastomeric base;

an alignment frame coupled to the heatsink base, the alignment frame supporting and aligning the plurality of slider pins as the slider pins move in a direction substantially perpendicular to the heatsink base wherein the desired position aligns the plurality of slider pins with a heat source; and at least one cushion spring between the elastomeric base and the alignment frame, the at least one cushion spring located proximate to a perimeter of the plurality of slider pins; and applying a compression load to the heat spreader to compress the heat spreader to the substrate until the thermal interface material has a desired bondline thickness.

14. The method of claim 13, further comprising securing the heat spreader to the substrate.

15. The method of claim 13, wherein the heat spreader further includes a captivated heat transfer material contained in a cavity between the elastomeric base and the heatsink base.

16. The method of claim 15, wherein the heat spreader further includes:

an inlet coupled to the cavity between the elastomeric base and the heatsink base; and an outlet coupled to the cavity between the elastomeric base and the heatsink base.

17. The method of claim 16, further comprising flowing the captivated heat transfer material into, through and out of the cavity between the elastomeric base and the heatsink base.

* * * * *